(12) United States Patent
Macheiner et al.

(10) Patent No.: US 9,087,829 B2
(45) Date of Patent: Jul. 21, 2015

(54) SEMICONDUCTOR ARRANGEMENT

(75) Inventors: Stefan Macheiner, Kissing (DE);
Andreas Peter Meiser, Sauerlach (DE);
Steffen Thiele, Munich (DE)

(73) Assignee: Infineon Technologies AG, Neubiberg (DE)

( * ) Notice: Subject to any disclaimer, the term of this patent is extended or adjusted under 35 U.S.C. 154(b) by 878 days.

(21) Appl. No.: 13/204,347

(22) Filed: Aug. 5, 2011

(65) Prior Publication Data
US 2013/0032855 A1 Feb. 7, 2013

(51) Int. Cl.
*H01L 29/66* (2006.01)
*H01L 23/495* (2006.01)
*H01L 23/00* (2006.01)
*H01L 25/07* (2006.01)
*H01L 23/31* (2006.01)

(52) U.S. Cl.
CPC .... *H01L 23/49575* (2013.01); *H01L 23/49524* (2013.01); *H01L 23/49562* (2013.01); *H01L 24/49* (2013.01); *H01L 25/072* (2013.01); *H01L 23/3107* (2013.01); *H01L 2224/48137* (2013.01); *H01L 2224/48247* (2013.01); *H01L 2224/4903* (2013.01); *H01L 2224/49171* (2013.01); *H01L 2924/1305* (2013.01); *H01L 2924/1306* (2013.01); *H01L 2924/13055* (2013.01); *H01L 2924/13091* (2013.01); *H01L 2924/30107* (2013.01)

(58) Field of Classification Search
None
See application file for complete search history.

(56) References Cited

U.S. PATENT DOCUMENTS

| | | |
|---|---|---|
| 5,043,859 A | 8/1991 | Korman et al. |
| 5,544,038 A | 8/1996 | Fisher et al. |
| 6,269,014 B1 | 7/2001 | Sander et al. |
| 7,800,217 B2 | 9/2010 | Otremba et al. |
| 7,943,955 B2 | 5/2011 | Haeberlen et al. |
| 2002/0145184 A1 | 10/2002 | Perugupalli et al. |
| 2004/0135248 A1 | 7/2004 | Takagawa et al. |
| 2007/0090496 A1 | 4/2007 | Otremba |
| 2008/0061396 A1 | 3/2008 | Havanur |
| 2009/0189291 A1 | 7/2009 | Landau et al. |
| 2009/0256247 A1 | 10/2009 | Landau et al. |
| 2009/0294936 A1* | 12/2009 | Liu et al. ......... 257/675 |
| 2010/0284153 A1 | 11/2010 | Hohlfeld et al. |
| 2011/0024884 A1 | 2/2011 | Xue et al. |

FOREIGN PATENT DOCUMENTS

DE 40 40 691 A1 6/1991
DE 199 35 100 B4 10/2004
(Continued)

OTHER PUBLICATIONS

Meiser, A. et al. "Vertical Transistor Component." Co-pending U.S. Appl. No. 12/836,422, filed Jul. 14, 2010.

*Primary Examiner* — Marvin Payen
(74) *Attorney, Agent, or Firm* — Murphy, Bilak & Homiller, PLLC

(57) ABSTRACT

A semiconductor arrangement includes a first and second controllable vertical n-channel semiconductor chip. Each of the controllable vertical n-channel semiconductor chips has a front side, a rear side opposite the front side, a front side main contact arranged on the front side, a rear side main contact arranged on the rear side, and a gate contact arranged on the front side for controlling an electric current between the front side main contact and the rear side main contact. The rear side contacts of the first and second semiconductor chips are electrically connected to one another.

16 Claims, 6 Drawing Sheets

(56) References Cited

FOREIGN PATENT DOCUMENTS

| DE | 10 2005 013 533 A1 | 10/2006 |
| DE | 102007006447 A1 | 8/2007 |
| DE | 10 2006 021 959 A1 | 11/2007 |
| DE | 102006021959 A1 | 11/2007 |
| DE | 102006038479 A1 | 2/2008 |
| DE | 10 2010 000 208 A1 | 1/2011 |
| DE | 102009002992 A1 | 2/2011 |
| EP | 0776041 A2 | 5/1997 |

* cited by examiner

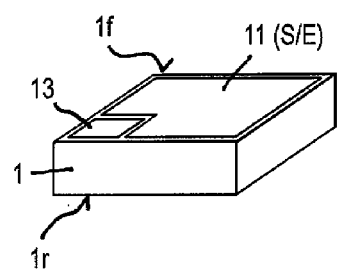
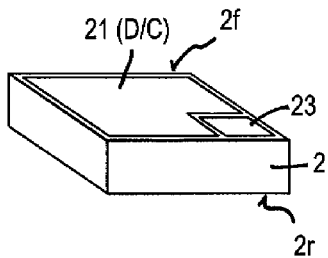
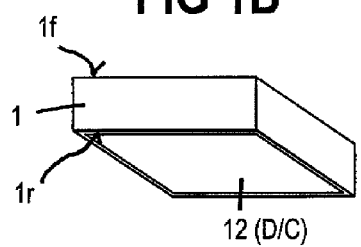
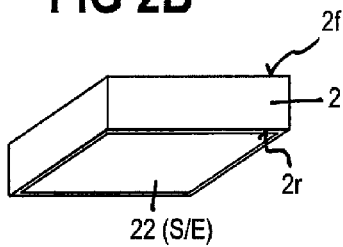
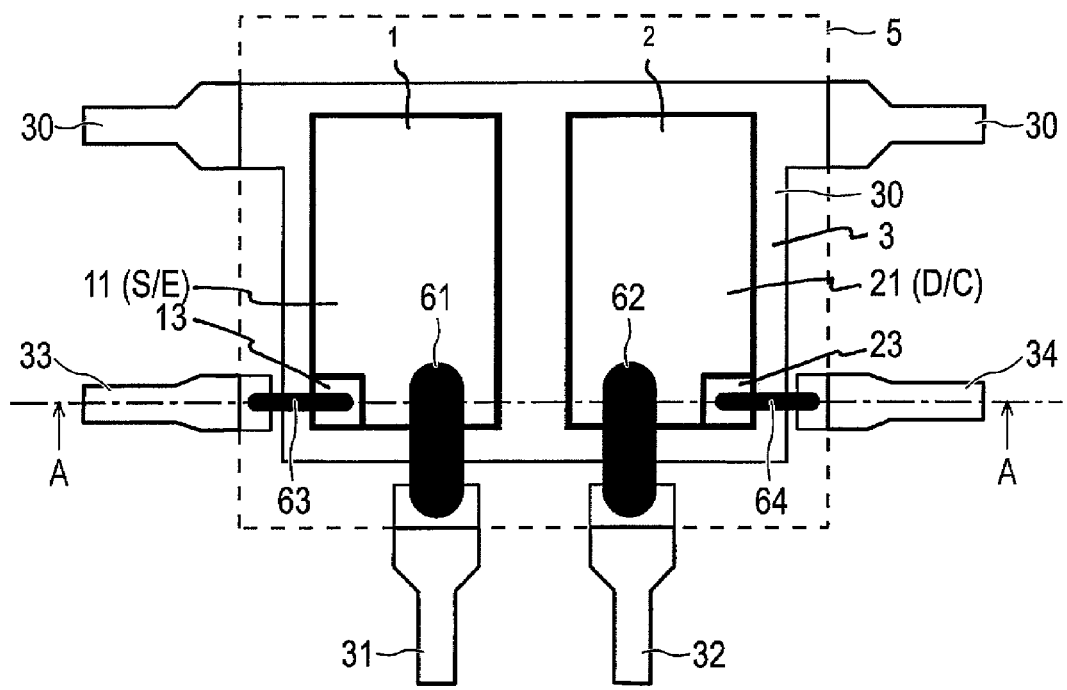
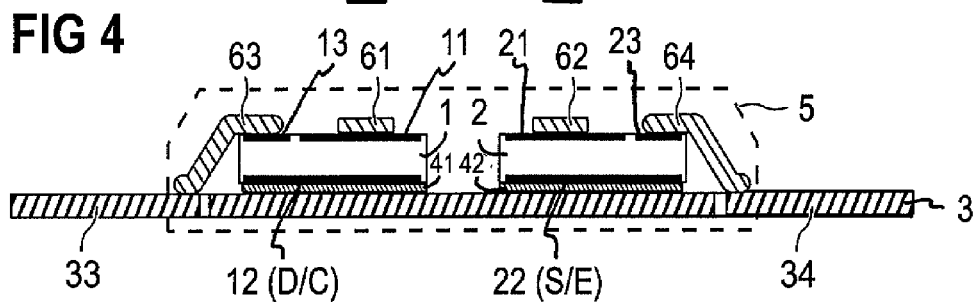

SEMICONDUCTOR ARRANGEMENT

TECHNICAL FIELD

The present application relates to semiconductor arrangements.

BACKGROUND

In many semiconductor arrangements, two semiconductor switches are connected to form a half bridge. Such half bridges can be used in power supplies for motors, in rectifiers, power converters etc. However, producing the electrical connections of such half bridge arrangements is complex and costly, and the inductivity of the required electrical connection between the semiconductor switches causes undesirable electromagnetic stray radiation.

Therefore, there is a need for an improved semiconductor arrangement.

SUMMARY

According to one embodiment, a semiconductor arrangement includes a first and second controllable vertical n-channel semiconductor chip. Each of the controllable vertical n-channel semiconductor chips has a front side, a rear side opposite the front side, a front side main contact arranged on the front side, a rear side main contact arranged on the rear side, and a gate contact arranged on the front side for controlling an electric current between the front side main contact and the rear side main contact. The rear side contacts of the first and second semiconductor chips are electrically connected to one another.

According to another embodiment, a semiconductor arrangement includes a number of N sub-arrangements. Each of the N sub-arrangements has a first and second controllable vertical n-channel semiconductor chip. Each one of the semiconductor chips has a front side, a rear side opposite the front side, a front side main contact arranged on the front side, a rear side main contact, arranged on the rear side, and a gate contact arranged on the front side for controlling an electric current between the front side main contact and the rear side main contact. For each of the N sub-arrangements, the rear side contacts of the first and second semiconductor chips of the respective sub-arrangement are electrically connected to one another.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 1A is a perspective oblique view of a first semiconductor chip that shows the front side the first semiconductor chip.

FIG. 1B is a perspective oblique view that shows the rear side of the first semiconductor chip of FIG. 1A.

FIG. 2A is a perspective oblique view of a second semiconductor chip that shows the front side of the second semiconductor chip.

FIG. 2B is a perspective oblique view that shows the rear side of the second semiconductor chip of FIG. 2A.

FIG. 3 is a top view of a semiconductor device that includes a half bridge formed of a series connection of a first semiconductor chip as illustrated in FIGS. 1A and 1B and a second semiconductor chip as illustrated in FIGS. 2A and 2B.

FIG. 4 is a cross-sectional view of the semiconductor device of FIG. 3 in a cross-sectional plane A-A.

DETAILED DESCRIPTION

Figure 5A:
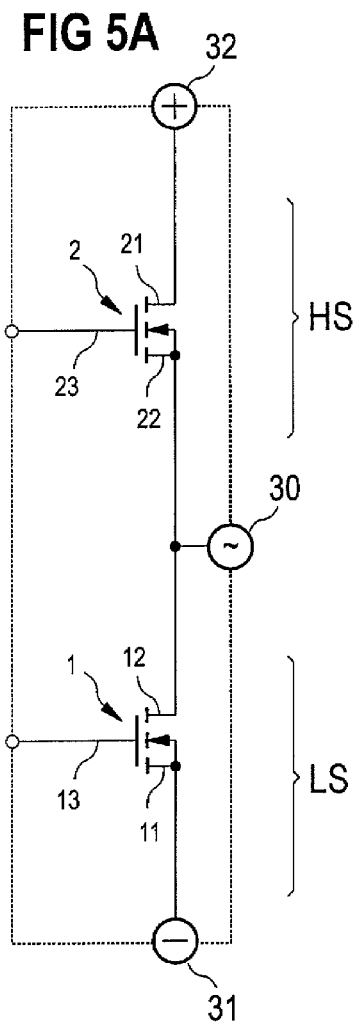
FIG. 5A is a circuit diagram of a half bridge that is formed of a series connection of a first semiconductor chip as illustrated in FIGS. 1A and 1B and a second semiconductor chip as illustrated in FIGS. 2A and 2B, wherein the first and second semiconductor chips are MOSFETs.

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Referring now to FIG. 1A there is illustrated a first semiconductor chip 1 which, for instance, may be a MOSFET (metal oxide semiconductor field effect transistor) or an IGBT (insulated gate bipolar transistor), in a perspective oblique top view. The first semiconductor chip 1, which is a vertical n-channel device, has a front side 1f and a rear side 1r opposite the front side if. A front side main contact 11 and a gate contact 13 are both arranged on the front side 1f. As further can be seen from the corresponding perspective oblique bottom view of the first semiconductor chip 1 in FIG. 1B, a rear side main contact 12 is arranged on the rear side 1r. The front side main contact 11 may be a source or emitter contact and the rear side contact 1r a drain or collector contact, respectively. In the drawings, source, drain, collector and emitter are indicated by "S", "D", "C" and "E", respectively.

The gate contact 13 of the first semiconductor chip 1 serves to control an electric current between the front side main contact 11 and the rear side main contact 12. The gate contact 13 may simply be used to switch an electric current between the front side main contact 11 and the rear side main contact 12 ON or OFF. However, the gate contact 13 may also be used to adjust an electric current between the front side main contact 11 and the rear side main contact 12 to an arbitrary value between substantially 0 A (Ampere) if the first semiconductor chip 1 is turned OFF and a maximum current that establishes if the first semiconductor chip 1 is turned ON. The phrase "substantially 0 A" is intended to mean "0 A except of an unavoidable residual current".

Accordingly, in FIG. 2A there is illustrated a second semiconductor chip 2 which, for instance, may also be a MOSFET or an IGBT, in a perspective oblique top view. The second semiconductor chip 2, which is also a vertical n-channel device, has a front side 2f and a rear side 2r opposite the front side 2f. A front side main contact 21 and a gate contact 23 are both arranged on the front side 2f. As further can be seen from the corresponding perspective oblique bottom view of the second semiconductor chip 2 in FIG. 2B, a rear side main contact 22 is arranged on the rear side 2r. The gate contact 23 serves to control an electric current between the front side main contact 21 and the rear side main contact 22.

The gate contact 23 may simply be used to switch an electric current between the front side main contact 21 and the rear side main contact 22 ON or OFF. However, the gate contact 23 may also be used to adjust an electric current between the front side main contact 21 and the rear side main contact 22 to an arbitrary value between substantially 0 A if the second semiconductor chip 2 is turned OFF and a maximum current that establishes if the second semiconductor chip 2 is turned ON.

The front side main contact 21 of the second semiconductor chip 2 is a drain or collector contact, the rear side main contact 22 of the second semiconductor chip 2 is a source or emitter contact, respectively. In contrast to conventional controllable vertical n-channel semiconductor chips, where the gate contact is on the same side as the source or emitter contact, the gate contact 23 of the second semiconductor chip 2 is on the same (front) side 2f as the drain or collector contact 21.

Using a series connection of a first semiconductor chip 1 as explained with reference to FIGS. 1A and 1B and a second semiconductor chip 2 as explained with reference to FIGS. 2A and 2B, a half bridge may be formed by electrically conductively connecting the rear side contact 12 of the first semiconductor chip 1 and the rear side contact 22 of the second semiconductor chip 2 to one another.

Figure 5B:
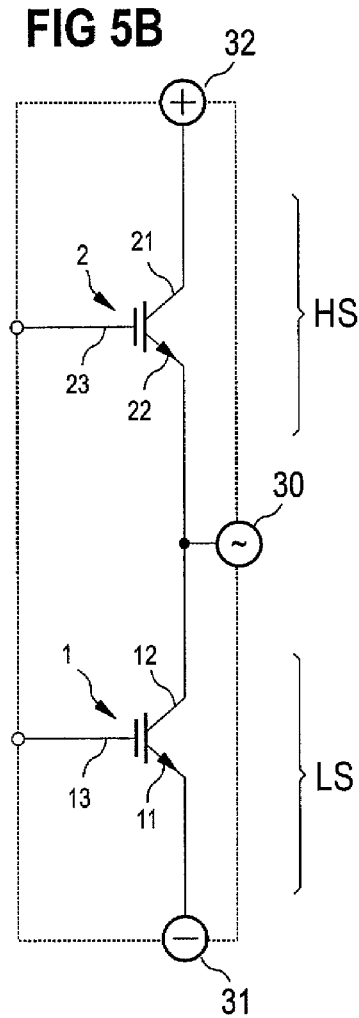
FIG. 5B is a circuit diagram of a half bridge that is formed of a series connection of a first semiconductor chip as illustrated in FIGS. 1A and 1B and a second semiconductor chip as illustrated in FIGS. 2A and 2B, wherein the first and second semiconductor chips are IGBTs.

An embodiment of such a half bridge device is illustrated in FIG. 3 which shows a top view of a plastic molded semiconductor component. In order to demonstrate the internal configuration, the housing 5 which is formed by a mold compound is removed. However, the boundaries of the housing 5 are indicated by a dashed line. A cross-sectional view of the device in a sectional plane A-A is shown in FIG. 4. FIG. 5A is a circuit diagram of the half bridge device if both the first and second semiconductor chips 1, 2 are n-channel MOSFETs, and FIG. 5B is a circuit diagram of the half bridge device if both the first and second semiconductor chips 1, 2 are n-channel IGBTs. The first semiconductor chips 1 are also designated as "low side chips" and the second semiconductor chips 2 as "high side chips".

The device includes a metallic, electrically conductive lead frame 3 that has a number of sections 30, 31, 32, 33, 34 spaced distant from one another. Both the first and second semiconductor chip 1, 2 are commonly arranged on the same side of section 30 which is a continuous section and which electrically connects the rear side contacts 12, 22 of the first and second semiconductor chip 1, 2. The continuous section 30 and the other sections 31, 32, 33 and 34 protrude from the housing 5 so as to allow for an external electrical connection of the component. The rear sides 1r and 2r and, accordingly, the rear side contacts 12 and 22 of the first and second semiconductor chip 1, 2 are facing toward the common section 30 and toward the lead frame 3.

The required electrical connections between the rear side contacts 12 and 22 and the continuous section 30 is realized by first and second connection layers 41 and 42, respectively. The first connection layer 41 is arranged between and electrically connects the common section 30 and the rear side main contact 12 of the first semiconductor chip 1. Accordingly, the second connection layer 42 is arranged between and electrically connects the common section 30 and the rear side main contact 22 of the second semiconductor chip 2. The first connection layer 41 may directly abut against the common section 3 and against the rear side main contact 12 of the first semiconductor chip 1, and the second connection layer 42 may directly abut against the common section 3 and against the rear side main contact 22 of the second semiconductor chip 2. For instance, the first and second connection layers 41, 42 may be solder layers, sintered layers comprising silver, or layers of an electrically conductive adhesive.

So as to electrically connect the front side main contact 11 and the gate contact 13 of the first semiconductor chip 1 and the front side main contact 21 and the gate contact 23 of the second semiconductor chip 2 to corresponding sections 31, 33, 32 and 34, respectively, electrically conductive connection elements 61, 63, 62 and 64, respectively, are used. As electrically conductive connection elements 61, 62, 63, 64 bonded wires, bonded, soldered or sintered ribbons or metal plates may be used. Thereby, identical or arbitrary mixed connection technologies may be used.

In many applications, the half bridge is supplied with electrical power via the sections 31 (positive supply voltage) and 32 (negative supply voltage) and the first and second semiconductor chips 1, 2 are alternately switched ON and OFF. That is, in a first switching state, the second semiconductor chip 2 is in an OFF state if the first semiconductor chip 1 is in an ON state, and in a second switching state, the first semiconductor chip 1 is in an OFF state if the second semiconductor chip 2 is in an ON state. When switching from the first switching state to the second switching state, or, reversely, from the second to the first switching state, between the first and second switching state there is an intermediate state in which both the first and semiconductor chips 1, 2 are OFF.

Consequently, during normal switching operation of the half bridge component, the common section 30 is alternately connected to either the positive or negative supply voltage. Hence, in order to reduce electromagnetic stray radiation it is advantageous to ensure that the common section 30 has low inductivity. For instance, such a low inductivity can be achieved if the common section 30 has a sub-section underneath and between the first and second semiconductor chips 1 and 2 which is a flat or substantially flat metal plate.

Figure 6:
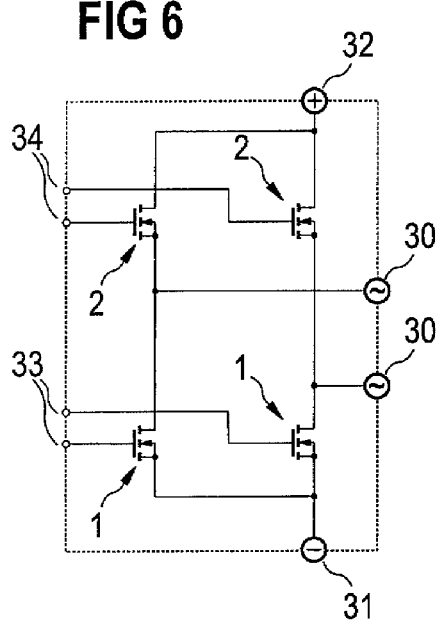
FIG. 6 is a circuit diagram of a 2-phase bridge that is formed of two half bridges as illustrated in FIG. 5A.
Figure 7:
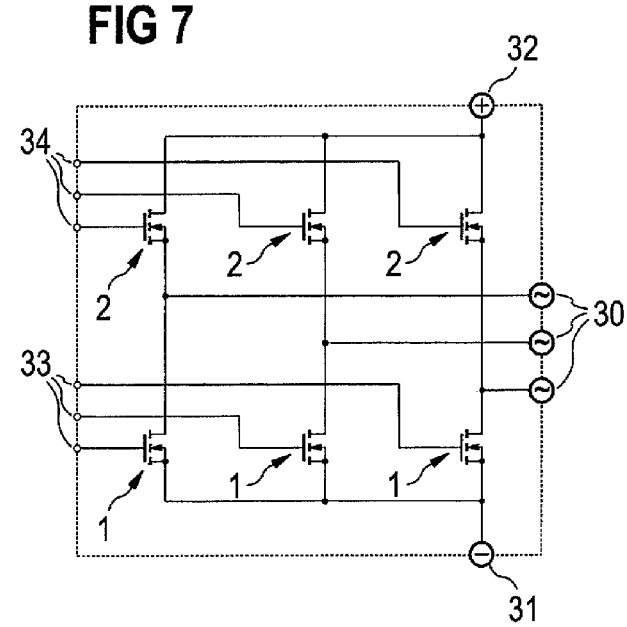
FIG. 7 is a circuit diagram of a 3-phase bridge that is formed of three half bridges as illustrated in FIG. 5A.

FIG. 6 is a circuit diagram of a 2-phase bridge that is formed of two half bridges as illustrated in FIG. 5A, and FIG. 7 is a circuit diagram of a 3-phase bridge that is formed of three half bridges as illustrated in FIG. 5A. Alternatively, a 2-phase bridge or a 3-phase bridge could be formed using two or three half bridges according to FIG. 5B instead of the half bridges according to FIG. 5A.

Again, in any 2-phase bridge or 3-phase bridge, the first semiconductor chips 1 are embodied as illustrated in and described with reference to FIGS. 1A and 1B. Accordingly, the second semiconductor chips 2 are embodied as illustrated in and described with reference to FIGS. 2A and 2B.

Figure 8:
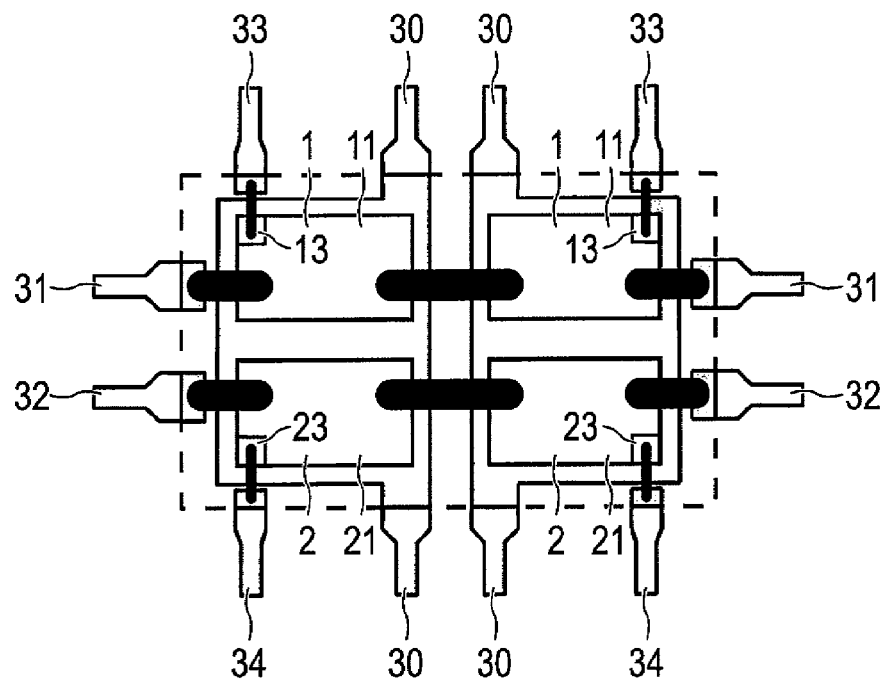
FIG. 8 is a top view of a semiconductor device that includes a 2-phase bridge according to the circuit diagram of FIG. 6.
Figure 9:
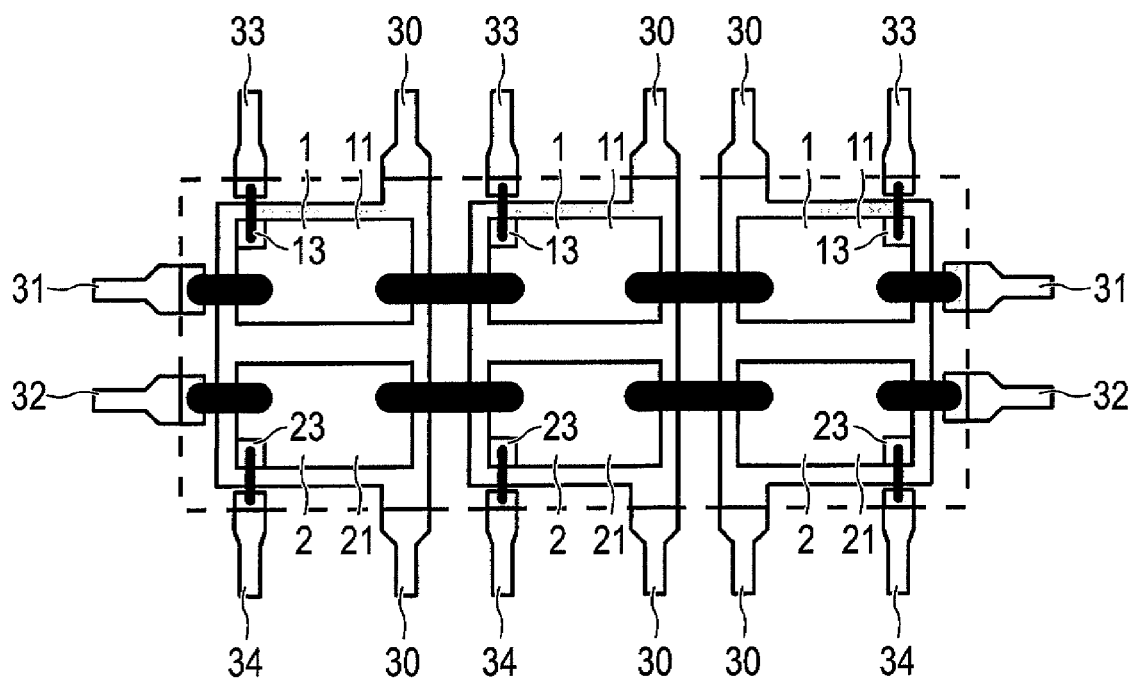
FIG. 9 is a top view of a semiconductor device that includes a 3-phase bridge according to the circuit diagram of FIG. 7.

FIGS. 8 and 9 are top views of a 2-phase bridge component and a 3-phase bridge component, respectively, in which all half bridges of the respective bridge are arranged within a common molded housing 5 which in FIGS. 8 and 9 is removed. However, the boundaries of the housing 5 are indicated by a dashed line in the same manner as in FIGS. 3 and 4. The 2-phase bridge component of FIG. 8 includes either an electronic circuit according to FIG. 6, or an electronic circuit according to FIG. 6 in which the MOSFETs 1 and 2 are replaced by vertical n-channel IGBTs. Accordingly, the 3-phase bridge component of FIG. 9 includes either an electronic circuit according to FIG. 7, or an electronic circuit according to FIG. 7 in which the MOSFETs 1 and 2 are replaced by vertical n-channel IGBTs.

In both the 2-phase bridge of FIG. 8 and the 3-phase bridge of FIG. 9, the half bridges forming the 2-phase bridge and the 3-phase bridge, respectively, have common inputs 31 and 32 for receiving a negative and positive supply voltage. However, the phase outputs 30 of the different half bridges are not connected to one another but led out of the housing 5 separately from one another. Also all inputs 33 and 34 electrically connected to the gate contacts 13 and 23, respectively, are separately led out of the housing 5. In both arrangements of FIGS. 8 and 9, the front side main contacts 11 of all first semiconductor chips 1 may be electrically interconnected to one another inside the housing 5. Accordingly, the front side main contacts 21 of all second semiconductor chips 2 may be electrically interconnected to one another inside the housing 5.

Generally, an N-phase bridge includes N half bridges as explained with reference to FIGS. 5A and 5B, whereby each of the N half bridges forms a sub-arrangement. Two or more of such sub-arrangements can be connected to a common power supply so as to form an N-phase bridge. For instance, N may be ≥1, or ≥2, or N≥3.

Figure 10:
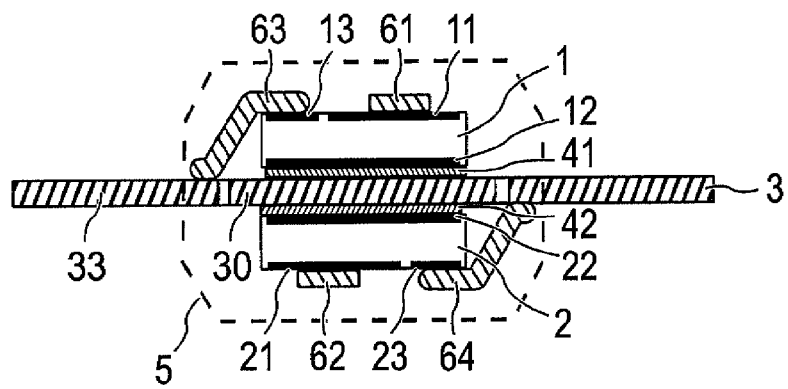
FIG. 10 is a top view of a semiconductor device that includes a half bridge, wherein the first and second semiconductor chips of the half bridge are arranged on opposing sides of a lead frame.

FIG. 10 is a top view of a semiconductor component that includes a half bridge according to FIG. 5A or 5B formed of the same kinds of first and second semiconductor chips 1, 2 as the component of FIGS. 3 and 4. However, the half bridge component of FIG. 10 differs from the half bridge components of FIGS. 3 and 4 in that the first and second semiconductor chips 1, 2 are arranged on opposing sides of the continuous section 30. However, as in FIG. 4, the rear sides 1r and 2r of both semiconductor chips 1, 2 are facing toward the continuous section 30, and the gate contacts 13 and 23 are arranged on the front sides 1f and 2f of the respective semiconductor chip 1 and 2. In the same way, a 2- or 3-phase bridge component could include two or three half bridges with the first and second semiconductor chip 1, 2 of the each half bridge arranged in the same manner as illustrated in FIG. 10. As in the 2- and 3-phase bridge components illustrated in FIGS. 8 and 9, the front side main contacts 11 of all first semiconductor chips 1 may be electrically interconnected to one another inside the housing 5. Accordingly, the front side main contacts 21 of all second semiconductor chips 2 may be electrically interconnected to one another inside the housing 5.

Figure 11:
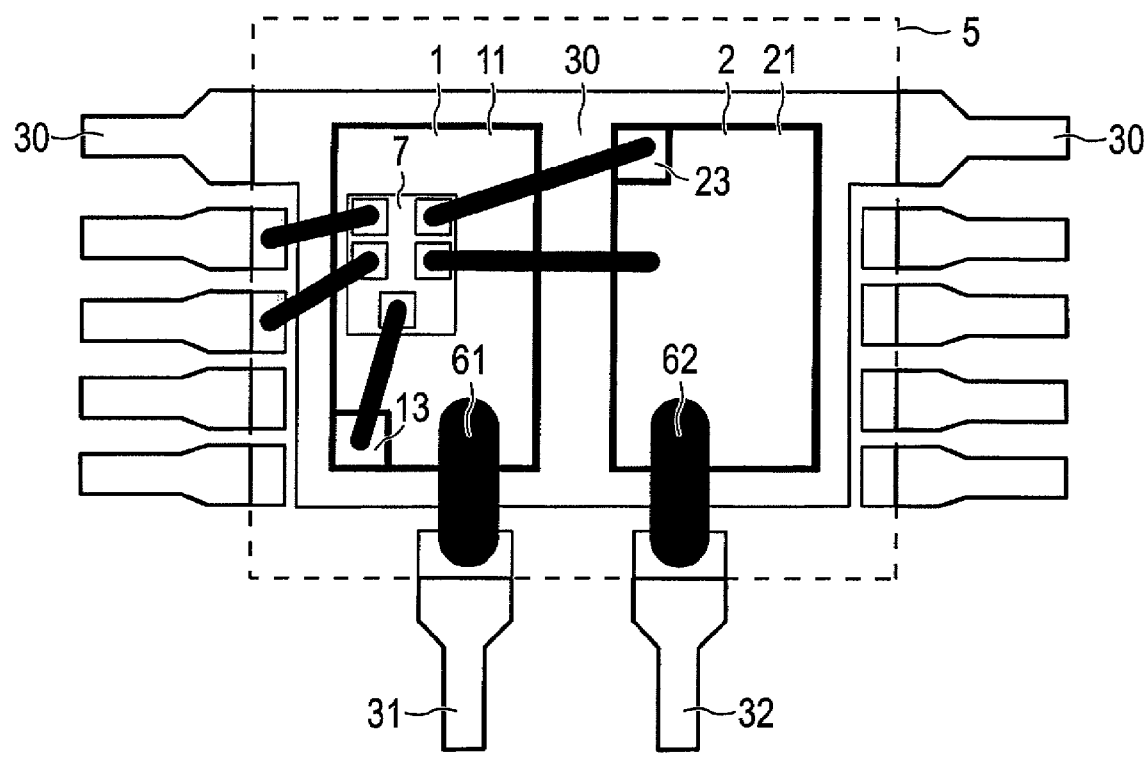
FIG. 11 is a top view of a semiconductor device that includes a half bridge, wherein a control chip is arranged on the top side of the first semiconductor chip.
Figure 12:
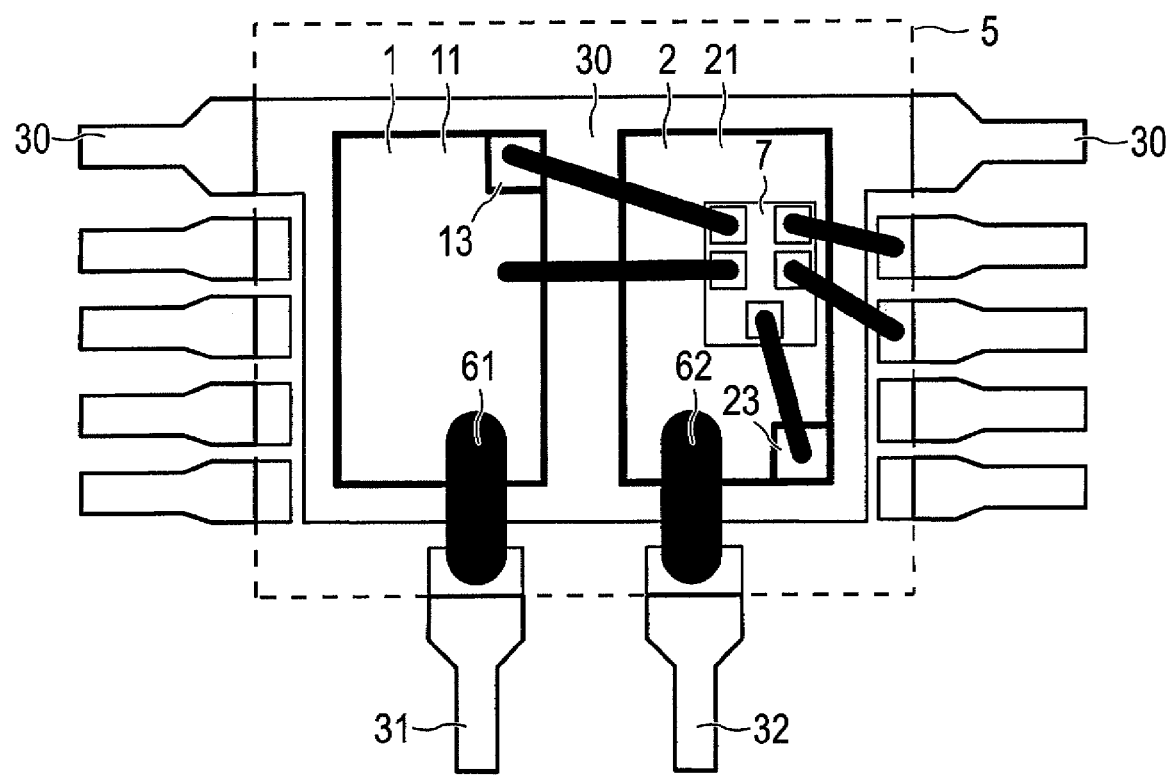
FIG. 12 is a top view of a semiconductor device that includes a half bridge, wherein a control chip is arranged on the top side of the second semiconductor chip.

FIGS. 11 and 12 illustrate further embodiments of half bridge components in which a common control circuit 7 for controlling both the first and second semiconductor chips 1, 2 of the half bridge is arranged on either the front side main contact 11 of the first semiconductor chip 1 (FIG. 11) or on the front side main contact 21 of the second semiconductor chip 2 (FIG. 12). The control circuit 7 receives its supply voltage from the voltage between the front side main contact 11 of the first semiconductor chip 1 and the front side main contact 21 of the second semiconductor chip 2.

To this end, in FIG. 11 the control circuit 7 is directly soldered, sintered or electrically conductively adhered to the respective front side main contact 11 of the first semiconductor chip 1, whereas the control circuit 7 is electrically connected to the front side main contact 21 of the second semiconductor chip 2 via a bonding wire, a ribbon, a metal plate etc.

In FIG. 12, the control circuit 7 is directly soldered, sintered or electrically conductively adhered to the respective front side main contact 21 of the second semiconductor chip 2, whereas the control circuit 7 is electrically connected to the front side main contact 11 of the first semiconductor chip 1 via a bonding wire, a ribbon, a metal plate etc.

In the same way, in a 2-phase bridge as explained with reference to FIG. 8 or in a 3-phase bridge as explained with reference to FIG. 9, each half bridge can be provided with a control circuit 7 as described with reference to FIG. 11 or 12. Alternatively, a common control circuit 7 that controls all controllable semiconductor chips 1, 2 of the 2- or 3-phase bridge via the respective gate contacts 13 and 23, may be arranged in the described manner on the front side main contact 11, 21 of only one of the first and second semiconductor chips 1, 2.

In other embodiments of such semiconductor components, a common control circuit 7 may also be arranged on either the front side main contact 11 of the first semiconductor chip 1 according to FIG. 11 or on the front side main contact 21 of the second semiconductor chip 2 according to FIG. 12 with the difference that the control circuit 7 is not directly soldered, sintered or electrically conductively adhered to the front side main contact 11 of the first semiconductor chip 1 (FIG. 11) or to the front side main contact 21 of the second semiconductor chip 2 (FIG. 12). In such arrangements, the body of the common control circuit 7 is mounted on the front side main contact 11 of the first semiconductor chip 1 (FIG. 11) or on the front side main contact 21 of the second semiconductor chip 2 (FIG. 12) in an electrically insulated fashion. In these cases, the common control circuit 7 is electrically connected to both the front side main contact 11 of the first semiconductor chip 1 (negative supply voltage) and the front side main contact 21 of the second semiconductor chip 2 (positive supply voltage) using separate electrically conductive connection elements like bonding wires, ribbons, metal plates etc.

As an example for a second semiconductor chip 2 having a structure as described with reference to FIGS. 2A and 2B, FIGS. 13A and 13B schematically illustrate vertical cross sections through a second semiconductor chip 2 which is a vertical n-channel transistor component. The transistor component can be implemented as a MOSFET or as an IGBT. In the following example, the transistor component is a MOSFET. An IGBT has almost the same structure. The sole structural difference is that in an n-channel MOSFET, the region 214 is n-conductive, whereas in an n-channel IGBT, the region 214 is p-conductive. All other differences relate to different terminology which will be explained below.

The second semiconductor chip 2 includes a semiconductor body 200 with a rear side 2r and with a front side 2f which is opposite the rear side 2r. The semiconductor body 200 may comprise any suitable and commonly known semiconductor material, such as silicon (Si), silicon carbide (SiC), gallium arsenide (GaAs), or gallium nitride (GaN). The semiconductor body 200 includes an n-conductive drift region 213, an n-conductive source region 211, and a p-conductive body region 212 arranged between the drift region 213 and the rear side 2r and further between the source region 211 and the drift region 213. An n-conductive drain region 214 which more highly doped than the drift region 213 is arranged between the drift region 213 and the front side 2f.

The source and drain regions 211, 214 are more highly doped than the drift region 213 and the drain region 214 is more highly doped than the drift region 213. The doping concentration of the drift region 213 is, for example, in the range of between $10^{15}$ (E15) $cm^{-3}$ and $10^{17}$ (E17) $cm^{-3}$, the doping concentration of the body region 212 is, for example, in the range of between $10^{16}$ (E16) $cm^{-3}$ and $10^{16}$ (E18) $cm^{-3}$, the doping concentration of the source region 211 is, for example, in the range of between $10^{19}$ (E19) $cm^{-3}$ and $10^{21}$ (E21) $cm^{-3}$, and the doping concentration of the drain region 214, is, for example, in the range of between $10^{19}$ (E19) $cm^{-3}$ and $10^{21}$ (E21) $cm^{-3}$.

Optionally, a field stop region (not shown) that is more highly doped than the drift region 213 can be arranged in the drift region 213 closer to the drain region 214 than to the body region 212, or between the drift region 213 and the drain region 214.

Figure 13A:
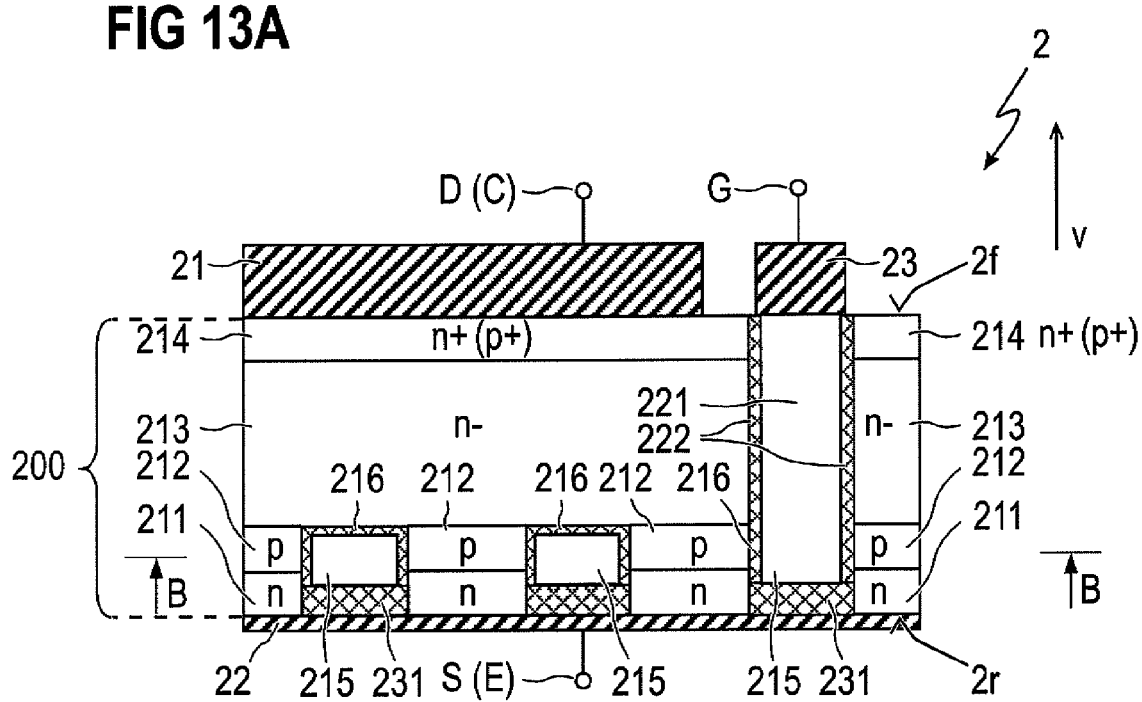
FIG. 13A illustrates a vertical cross section through second semiconductor chip according to FIGS. 2A and 2B.

Referring to FIG. 13A, the transistor component further includes at least one gate electrode 215. The gate electrode 215 is implemented as a trench electrode which is arranged in a trench that extends from the rear side 2r into the semiconductor body 200. The gate electrode 215 is arranged adjacent the body region 212 and in the vertical direction v of the semiconductor body 200 extends from the source region 211 through the body region 212 into the drift region 213. The gate electrode 215 is dielectrically insulated from the body region 212 and the source 211 and drift 213 regions by a gate dielectric 216. The gate electrode 215 can comprise any suitable gate electrode material, like a doped polycrystalline semiconductor material, such as polysilicon, or a metal. The gate dielectric 216 can comprise any suitable gate dielectric material, like an oxide, such as silicon oxide ($SiO_2$), a nitride, or a high-k dielectric.

A source electrode 22 forms the rear side main contact 22 which is a source terminal S of the transistor component 2. The rear side main contact 22 electrically contacts the source region 211. The rear side main contact 22 is arranged above the rear side 2r and is electrically insulated from the gate electrode 215 by a gate insulation layer 231. Optionally, the source electrode 22 also contacts the body region 212. In order to contact the body region 212, the rear side main contact 22 may include a contact plug which extends through the source region 211 into the body region 212. Alternatively, sections of the body region 212 may extend to the rear side 2r.

A gate connection electrode 221 which is electrically connected to the gate electrode 215 extends through the drift region 213 and the drain region 214 to the front side 2f and is dielectrically insulated from these semiconductor regions 213, 214 by a dielectric layer 222. For instance, the gate connection electrode 221 may be made of doped polycrystalline semiconductor material, such as polysilicon, or of metal. The dielectric layer 222 can be made of the same material as the gate dielectric 216, but can also be made of a different dielectric material. According to one embodiment, the dielectric layer 222 of the gate connection electrode 221 is thicker than the gate dielectric 216, i.e. a distance between the gate connection electrode 221 and its surrounding semiconductor region is larger than the distance between the gate electrode 215 and the body region 212.

A drain electrode 21 forms the front side main contact 21 which electrically contacts the drain region 214 and which forms a drain terminal D of the component. A gate contact electrode 23 forms the gate contact 23 which is electrically connected with the gate electrode 215 and which forms a gate terminal G of the transistor component. Both the front side main contact 21 and the gate contact 23 are arranged on the front side 2f of the transistor component. The gate electrode 215 is electrically connected to the gate contact electrode 23 via a gate connection electrode 221. The gate connection electrode 221 is arranged below the gate electrode 215 and extends from the gate electrode 215 to the front side 2f of the semiconductor body 200. The drain electrode 21 and the gate contact electrode 23 are arranged on the front side 2f spaced distant and electrically insulated from one another.

The transistor component may have a cellular structure. In this case there is a plurality of identical transistor cells, with each transistor cell including a body region 212, a source region 213 and a section of the gate electrode 215 adjacent to the body region 212. The individual transistor cells are connected in parallel by virtue of the fact that the source regions 211 (and optionally the body regions 212) are jointly connected to the common source electrode 22.

In the illustrated embodiment, the gate connection electrode 221 and its insulation layer 222 separate the drift region 213 and the drain region 214 into a plurality of sections with each of these sections belonging to one of the transistor cells. These drift region 213 and drain region 214 sections are jointly connected to the common drain electrode 21.

The gate electrode 215 and, therefore, the gate connection electrode 221 arranged below the gate electrode 215 may have a strip-like geometry. In this case the gate electrode 215 includes a plurality of strip-like gate electrode sections that are arranged in parallel with one another. The body and source regions 211, 212 are arranged between two of these gate electrode sections. The gate electrode 215 may have any other known gate electrode geometry as well such as, for example, a grid-like geometry. In this case, the gate electrode 215 in the horizontal plane has the geometry of a grid, like a rectangular, square, or hexagonal grid.

The illustrated vertical transistor component may be controlled like a commonly known vertical transistor by applying a suitable drive potential to the gate electrode 215, wherein the drive potential is applied to the gate electrode 215 via the gate contact electrode 23 and the gate connection electrode 21. The component is switched ON when this drive potential is such that a conducting channel is generated in the body region 212 between the source region 211 and the drift region 213, and the component is switched OFF when such conducting channel is interrupted. The component may be mounted to a carrier with the source electrode 22, i.e. such that the rear side 2r faces the carrier. This carrier may serve as a source terminal of the component, and can further serve as a heat sink for dissipating heat from the semiconductor component 2. For instance, the continuous section 30 described above with reference to FIGS. 3, 4, 8, 9, 10, 11 and 12 can serve as such a carrier.

When the transistor component is operated as a switch, heat is mainly generated in the region of the pn-junction between the source region 211 and the body region 212. Since the pn-junction is arranged closer to the rear side 2r than to the front side 2f, mounting a heat sink to the rear side 2r results in a lower thermal resistance for the heat to be dissipated.

In order to reduce the gate-drain capacitance of the component 2, the gate connection electrode 221 is not arranged everywhere below the gate electrode 215, but is arranged only below sections of the gate electrode 215. In this component there are two different types of trenches: gate trenches, and gate and connection trenches.

A gate trench is a trench in which only the gate electrode 215 or a section of the gate electrode 215 is arranged, and in which optionally a first field electrode (not illustrated) is arranged. Such a first field electrode may be integrally formed with the gate electrode 215 and is dielectrically insulated from the drift region 213 by a field electrode dielectric (not illustrated). According to a further embodiment (not illustrated), a field electrode may be electrically insulated from the gate electrode 215 and be electrically connected to the source electrode 41.

A gate and connection trench is a trench that includes the gate electrode 215 or a section of the gate electrode 215 and the gate connection electrode 221 or a section of the gate connection electrode 221, with the gate connection electrode 221 being arranged below the gate electrode 215 between the gate electrode 215 and the front side 2f.

In FIG. 13A, one gate and connection trench and two gate trenches are illustrated. The gate electrode section 215 arranged in the gate trenches are electrically connected with the gate electrode section 215 in the gate and connection trench so that the gate electrode 215 section in each trench is connected to the gate contact electrode 23 via the gate connection electrode 221.

Figure 13B:
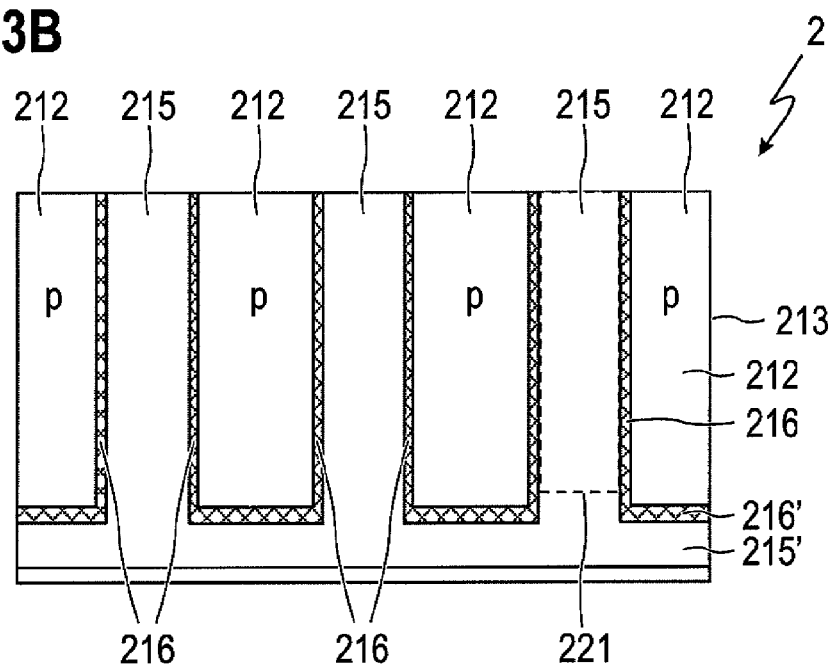
FIG. 13B illustrates a horizontal cross section through the transistor component of FIG. 13A.

FIG. 13B illustrates a horizontal cross section in a section plane B-B through the transistor component of FIG. 13A in order to illustrate one embodiment of electrically connecting the gate electrode 215 sections in the individual trenches with one another. In this embodiment the trenches, that is, the gate trenches and the gate and connection trench have a strip-like geometry. In FIG. 13B, the gate connection electrode 221 is illustrated in dashed fashion in the gate and connection trench.

A further connection trench extends perpendicular to the trenches and has a further connection electrode 215' that is electrically connected to the gate electrode section 215 in each of the trenches. The further connection electrode 215' therefore electrically connects the gate electrode sections 215 in the individual trenches with one another. The further connection electrode is dielectrically insulated from the semiconductor body 212 by a further dielectric layer 216'.

Instead of providing a connection trench with a further connection electrode 215', the gate electrode 215 could also be realized with a grid-like geometry which has gate electrode sections that are electrically connected with one another. In this case no additional connection electrode 215' is required.

In FIGS. 13A and 13B, the transistor component 2 is described by way of example as a vertical n-channel MOSFET. However, by changing the conduction type of the drain region 214 from "n" to "p", the transistor component 2 would be a vertical n-channel IGBT. This is the sole structural difference between a MOSFET and a corresponding IGBT. All other differences relate to different terminology as is well-known in the art. Instead of the terms "drain" and "source" used in connection with a MOSFET, the corresponding terms used in connection with an IGBT are "collector" and "emitter", respectively. That is, the terms "drain region 214", "drain electrode 21" and "drain terminal D" used in connection with a MOSFET correspond to the terms "collector region 214", "collector electrode 21" and "collector terminal C", respectively used in connection with an IGBT. Further, the terms "source region 211", "source electrode 22" and "source terminal S" used in connection with a MOSFET correspond to the terms "emitter region 211", "emitter electrode 22" and "emitter terminal E" used in connection with an IGBT.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor arrangement, comprising a metallic lead frame and a first and second controllable vertical n-channel semiconductor chip each comprising:
    a front side;
    a rear side opposite the front side;
    a front side main contact arranged on the front side;
    a rear side main contact arranged on the rear side; and
    a gate contact arranged on the front side for controlling an electric current between the front side main contact and the rear side main contact;
    wherein the rear side contacts of the first and second semiconductor chips are electrically connected to one another;
    wherein the rear side contacts of the first and second semiconductor chips face toward the lead frame and are electrically connected to one another by the lead frame;
    wherein the metallic lead frame comprises a continuous section which electrically connects the rear side contacts of the first and second semiconductor chips.

2. The semiconductor arrangement as claimed in claim 1, wherein the continuous section comprises a sub-section arranged underneath and between the first and second semiconductor chips, the sub-section being a flat or substantially flat metal plate.

3. The semiconductor arrangement as claimed in claim 1, further comprising:
    a first connection layer arranged between the lead frame and the rear side main contact of the first semiconductor chip; and
    a second connection layer arranged between the lead frame and the rear side main contact of the second semiconductor chip.

4. The semiconductor arrangement as claimed in claim 3, wherein the first connection layer directly abuts against the lead frame and against the rear side main contact of the first semiconductor chip, and the second connection layer directly abuts against the lead frame and against the rear side main contact of the second semiconductor chip.

5. The semiconductor arrangement as claimed in claim 1, wherein the first semiconductor chip and the second semiconductor chip are arranged on the same side of the lead frame.

6. The semiconductor arrangement as claimed in claim 1, wherein the first semiconductor chip and the second semiconductor chip are arranged on opposing sides of the lead frame.

7. The semiconductor arrangement as claimed in claim 1 further comprising:
   a molded housing;
   a first contact pin protruding from the molded plastic housing and providing a negative supply voltage to the front side main contact of the first semiconductor chip; and
   a second contact pin protruding from the molded plastic housing and providing a positive supply voltage to the front side main contact of the second semiconductor chip.

8. The semiconductor arrangement as claimed in claim 1, further comprising a control chip arranged on the front side contact of the first semiconductor chip, wherein the control chip is electrically connected to the front side contact of the second semiconductor chip and electrically connected to the gate contacts of the first and second semiconductor chip.

9. The semiconductor arrangement as claimed in claim 1, further comprising a control chip arranged on the front side contact of the second semiconductor chip, wherein the control chip is electrically connected to the front side contact of the first semiconductor chip and electrically connected to the gate contacts of the first and second semiconductor chip.

10. The semiconductor arrangement as claimed in claim 1, wherein the first and second semiconductor chips are MOSFETs or IGBTs.

11. The semiconductor arrangement as claimed in claim 1, wherein the front side main contact of the first semiconductor chip and the rear side main contact of the second semiconductor chip are source or emitter contacts, and the front side main contact of the second semiconductor chip and the rear side main contact of the first semiconductor chip are drain or collector contacts.

12. A semiconductor arrangement, comprising a metallic lead frame and a number of N sub-arrangements, each sub-arrangement comprising a first and second controllable vertical n-channel semiconductor chip, each semiconductor chip comprising:
   a front side;
   a rear side opposite the front side;
   a front side main contact arranged on the front side;
   a rear side main contact arranged on the rear side; and
   a gate contact arranged on the front side for controlling an electric current between the front side main contact and the rear side main contact;
   wherein for each of the N sub-arrangements, the rear side contacts of the first and second semiconductor chips of the respective sub-arrangement are electrically connected to one another;
   wherein the metallic lead frame comprises a number of N continuous sections spaced distant from one another;
   wherein for each of the N sub-arrangements, the rear side contacts of the first and second semiconductor chips face toward one of the continuous sections and are electrically connected to one another by that continuous section.

13. The semiconductor arrangement as claimed in claim 12, further comprising:
   a molded plastic housing;
   a first contact pin protruding from the molded plastic housing and providing a negative supply voltage to the front side main contacts of the first semiconductor chips of each of the N sub-arrangements; and
   a second contact pin protruding from the molded plastic housing and providing a positive supply voltage to the front side main contacts of the second semiconductor chips of each of the N sub-arrangements.

14. The semiconductor arrangement as claimed in claim 12, wherein $N \geq 1$ or $N \geq 2$ or $N \geq 3$.

15. The semiconductor arrangement as claimed in claim 12, wherein the first and second semiconductor chips of each of the N sub-arrangements are MOSFETs or IGBTs.

16. The semiconductor arrangement as claimed in claim 12, wherein for each of the N sub-arrangements, the front side main contact of the first semiconductor chip and the rear side main contact of the second semiconductor chip of the respective sub-arrangement are source or emitter contacts and the front side main contact of the second semiconductor chip and the rear side main contact of the first semiconductor chip of the respective sub-arrangement are drain or collector contacts.

* * * * *